(12) United States Patent
Park et al.

(10) Patent No.: US 9,130,040 B2
(45) Date of Patent: Sep. 8, 2015

(54) FINFET SEMICONDUCTOR DEVICE AND METHOD OF MANUFACTURING THE SAME

(71) Applicant: SAMSUNG ELECTRONICS CO., LTD., Suwon-si, Gyeonggi-do (KR)

(72) Inventors: JaeHoo Park, Hwaseong-si (KR); Daewon Ha, Seoul (KR); Uihui Kwon, Hwaseong-si (KR); Sung-Dae Suk, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/248,594

(22) Filed: Apr. 9, 2014

(65) Prior Publication Data

US 2014/0332863 A1 Nov. 13, 2014

(30) Foreign Application Priority Data

May 10, 2013 (KR) .................. 10-2013-0053210

(51) Int. Cl.
*H01L 29/78* (2006.01)
*H01L 29/66* (2006.01)
*H01L 27/092* (2006.01)

(52) U.S. Cl.
CPC ........ *H01L 29/785* (2013.01); *H01L 29/66795* (2013.01); *H01L 27/092* (2013.01); *H01L 29/7853* (2013.01)

(58) Field of Classification Search
CPC .............. H01L 27/092; H01L 29/785; H01L 29/66795; H01L 29/7853
USPC .................................................. 257/24, 288
See application file for complete search history.

(56) References Cited

U.S. PATENT DOCUMENTS

| 7,521,752 | B2 | 4/2009 | Kinoshita et al. | |
|---|---|---|---|---|
| 7,592,646 | B2 | 9/2009 | Numata | |
| 8,389,347 | B2 | 3/2013 | Tezuka et al. | |
| 2004/0217434 | A1 | 11/2004 | Lee et al. | |
| 2005/0156202 | A1* | 7/2005 | Rhee et al. ............... | 257/213 |
| 2005/0230763 | A1 | 10/2005 | Huang et al. | |
| 2006/0027870 | A1 | 2/2006 | Inaba | |
| 2007/0048947 | A1* | 3/2007 | Lee et al. ................. | 438/283 |
| 2008/0237655 | A1 | 10/2008 | Nakabayashi et al. | |
| 2008/0296702 | A1* | 12/2008 | Lee et al. ................. | 257/401 |
| 2011/0073952 | A1* | 3/2011 | Kwok et al. .............. | 257/368 |
| 2011/0278676 | A1* | 11/2011 | Cheng et al. ............. | 257/369 |
| 2011/0317486 | A1* | 12/2011 | Lu et al. ................... | 365/182 |
| 2012/0083107 | A1 | 4/2012 | Chang et al. | |
| 2012/0086053 | A1 | 4/2012 | Tseng et al. | |
| 2012/0104498 | A1 | 5/2012 | Majundar et al. | |
| 2012/0139046 | A1 | 6/2012 | Tan et al. | |
| 2012/0168913 | A1* | 7/2012 | Toh et al. ................. | 257/618 |

(Continued)

FOREIGN PATENT DOCUMENTS

| KR | 10-2005-0107090 A | 11/2005 |
|---|---|---|
| KR | 10-2007-0070890 A | 7/2007 |

*Primary Examiner* — Nathan Ha
(74) *Attorney, Agent, or Firm* — Lee & Morse, P.C.

(57) ABSTRACT

Provided are a semiconductor device and a method of manufacturing the same. The method of manufacturing a semiconductor device includes forming an active fin on a substrate; oxidizing a portion of the active fin to form an insulating pattern between the active fin and the substrate; forming a first gate pattern on the substrate, wherein the first gate pattern crosses the active fin; exposing the substrate on both sides of the first gate pattern; and forming source/drain regions on the exposed substrate.

20 Claims, 26 Drawing Sheets

(56) References Cited

U.S. PATENT DOCUMENTS

| | | | |
|---|---|---|---|
| 2013/0026539 A1* | 1/2013 | Tang et al. | 257/192 |
| 2013/0052778 A1* | 2/2013 | Liao et al. | 438/197 |
| 2013/0187206 A1* | 7/2013 | Mor et al. | 257/288 |
| 2013/0200455 A1* | 8/2013 | Lo et al. | 257/347 |
| 2013/0248999 A1* | 9/2013 | Glass et al. | 257/335 |
| 2014/0353719 A1* | 12/2014 | Kim | 257/192 |

* cited by examiner

FINFET SEMICONDUCTOR DEVICE AND METHOD OF MANUFACTURING THE SAME

CROSS-REFERENCE TO RELATED APPLICATION

Korean Patent Application No. 10-2013-0053210, filed on May 10, 2013, in the Korean Intellectual Property Office, and entitled: "Semiconductor Device and Method of Manufacturing The Same," is incorporated by reference herein in its entirety.

BACKGROUND

1. Field

The present disclosure herein relates to a semiconductor device and a method of manufacturing the same, and, more particularly, to a fin field effect transistor (FET) and a method of manufacturing the same.

2. Description of the Related Art

A semiconductor device includes an integrated circuit that consists of MOS (Metal Oxide Semiconductor) FETs. As the size and design rule of the semiconductor device becomes gradually small, the scale down of the MOSFETs is also being accelerated. A decrease in the size of the MOSFETs may cause a short channel effect and thus, the operating characteristic of the semiconductor device may deteriorate. Thus, various methods are being studied to form a semiconductor device having excellent performance while overcoming a limit following a high degree of integration of the semiconductor device.

SUMMARY

Embodiments provide methods of manufacturing a semiconductor device including forming an active fin on a substrate; oxidizing a portion of the active fin to form an insulating pattern between the active fin and the substrate; forming a first gate pattern on the substrate, wherein the first gate pattern crosses the active fin; exposing the substrate on both sides of the first gate pattern; and forming source/drain regions on the exposed substrate.

Forming the active fin on the substrate may include forming a first layer on the substrate; forming a second layer on the first layer; patterning the second layer to form a first portion of the active fine; and patterning the first layer to form a second portion of the active fin, and wherein an oxidation rate of the first layer may be higher than that of the second layer.

Patterning the first layer to form the second portion of the active fin may include forming a capping pattern that covers an upper surface and sidewalls of the first portion of the active fin; and etching the first layer by using the capping pattern as an etch mask.

Oxidizing the portion of the active fin to form the insulating pattern between the active fin and the substrate may include selectively oxidizing the second portion of the active fin.

The methods may further include forming device isolation patterns on the substrate, wherein the device isolation patterns may define an active pattern, the active fin may be formed on the active pattern and separated from the active pattern by the insulating pattern, and the insulating pattern may connect the device isolation patterns which are adjacent to each other and between which the insulating pattern is positioned.

The active fin may include a first region under the first gate pattern and second regions on both sides of the first gate pattern, and the exposing the substrate on both sides of the first gate pattern may include etching the second regions of the active fin to expose a portion of the insulating pattern; and etching the exposed portion of the insulating pattern.

In further embodiments, forming the source/drain regions on the exposed substrate may include growing an epitaxial layer from the exposed substrate.

The methods may further include forming gate spacers on both sidewalls of the first gate pattern.

The methods may further include forming an interlayer insulating layer on the substrate, wherein the interlayer insulating layer covers both sidewalls of the gate spacers and the source/drain regions; and replacing the first gate pattern with a second gate pattern, wherein the replacing of the first gate pattern with the second gate pattern may include removing the first gate pattern to form a gap region that exposes the active fin; forming a gate dielectric pattern that fills a portion of the gap region; and forming a metal gate pattern that fills remaining portions of the gap region.

Forming the active fin on the substrate may include patterning the substrate to form a first portion of the active fin; forming a capping pattern that covers an upper surface and sidewalls of the first portion of the active fin; and etching the substrate by using the capping pattern as an etch mask to form a second portion of the active fin, the second portion of the active fin having a width wider than that of the first portion of the active fin.

In other embodiments, semiconductor devices include a substrate including device isolation patterns; an active fin protruding from the substrate in a direction perpendicular to an upper surface of the substrate; an insulating pattern between the active fin and the substrate; a gate electrode on the active fin; and source/drain regions arranged on both sides of the gate electrode, wherein the source/drain regions are connected to the substrate, and wherein the insulating pattern is connected to the device isolation patterns which are adjacent to each other and between which the insulating pattern is positioned.

The active fin may be arranged between the source/drain regions and under the gate electrode and separated from the substrate by the insulating pattern.

A height of an upper surface of the insulating pattern may be lower than a height of a lowest surface of the gate electrode.

The insulating pattern may be arranged between the source/drain regions.

The source/drain regions may include an epitaxial layer grown from the substrate.

In other embodiments, semiconductor devices include a substrate having device isolation patterns defining active patterns, an active fin protruding from the substrate in a first direction perpendicular to an upper surface of the substrate, an insulating pattern between the active fin and the substrate, a gate electrode on the active fin, and source/drain regions on both sides of the gate electrode, wherein the source/drain regions are directly connected to the substrate, wherein the insulating pattern is between adjacent device isolation patterns and between the source/drain regions.

The active fin may extend in a second direction, perpendicular to the first direction, and the insulating pattern may be wider than the active fin in a third direction, perpendicular to the first and second directions.

The adjacent device isolation patterns may completely cover sidewalls of the insulating pattern along the first direction.

An upper surface of the active fin may be below an upper surface of the source/drain regions and a lower surface of the active fin may be above a lower surface of the source/drain regions along the first direction.

A lower surface of the insulating layer may be at a same level as the lower surface of the source/drain regions along the first direction.

BRIEF DESCRIPTION OF THE DRAWINGS

Features will become apparent to those of ordinary skill in the art by describing in detail exemplary embodiments with reference to the attached drawings in which:

FIGS. 2A through 10A illustrate perspective views of stages in a method of manufacturing a semiconductor device according to an embodiment;

FIGS. 2B through 10B illustrate cross-sectional views taken along lines I-I' of FIGS. 2A through 10A, respectively;

FIGS. 2C through 10C illustrate cross-sectional views taken along lines II-II' of FIGS. 2A through 10A, respectively;

FIGS. 11A through 13A illustrate perspective views of stages in a method of manufacturing a semiconductor device according to another embodiment;

FIGS. 11B through 13B illustrate cross-sectional views taken along lines I-I' of FIGS. 11A through 13A, respectively;

FIGS. 11C through 13C illustrate cross-sectional views taken along lines II-II' of FIGS. 11A through 13A, respectively.

DETAILED DESCRIPTION

Figure 1:
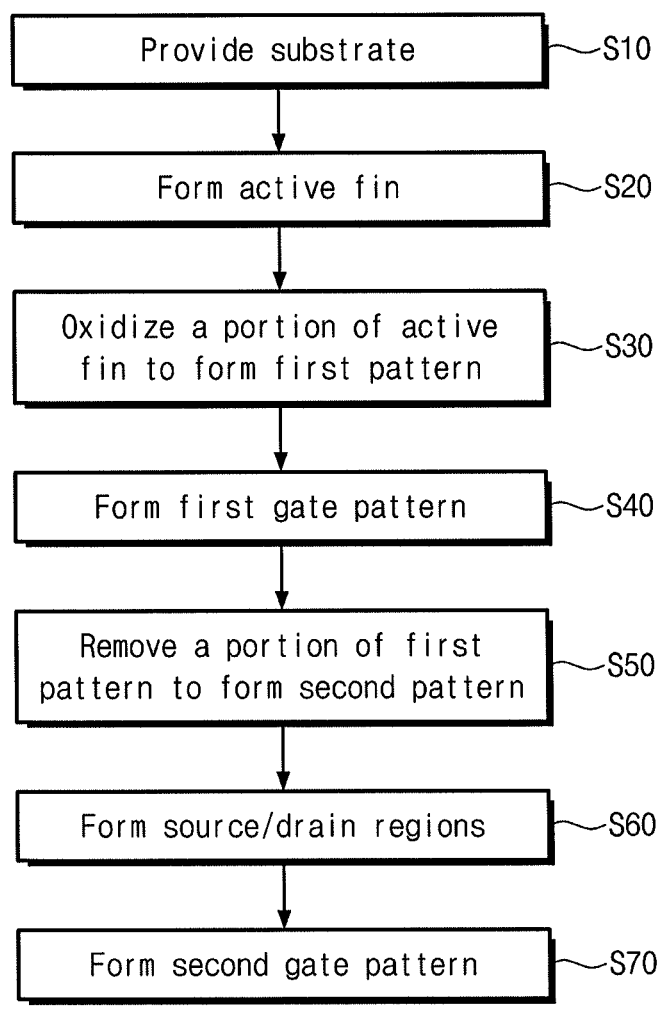
FIG. 1 illustrates a flow chart of a method of manufacturing a semiconductor device according to embodiments.
Figure 2A:
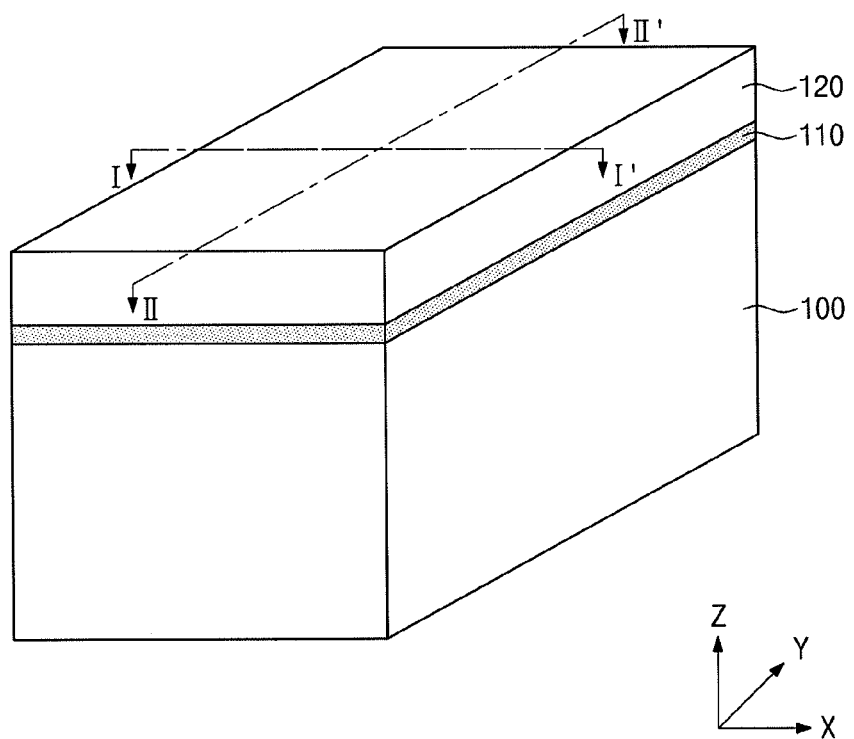
Figure 2B:
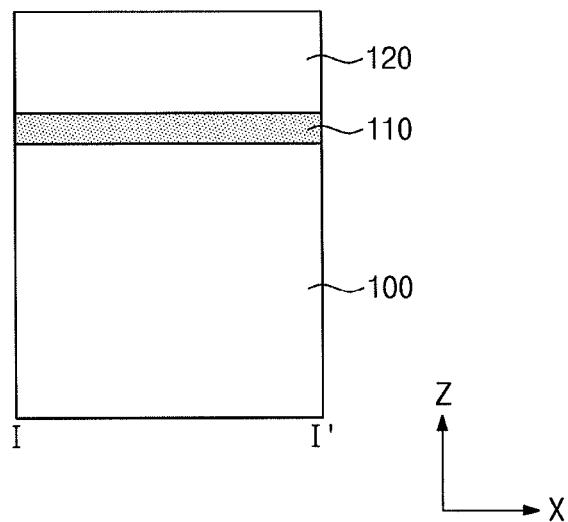
Figure 2C:
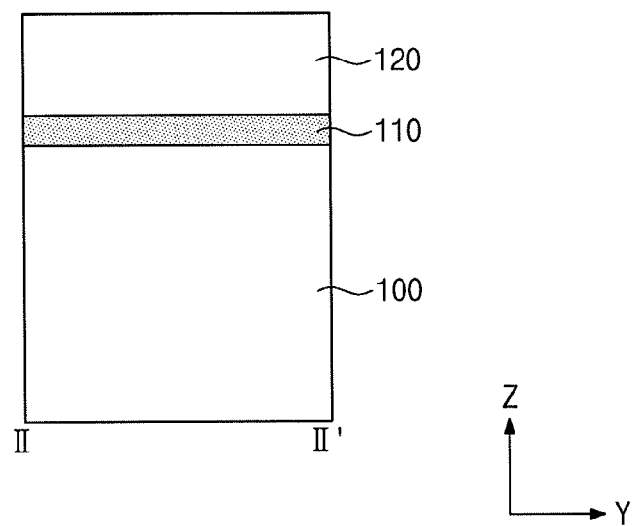
Figure 3A:
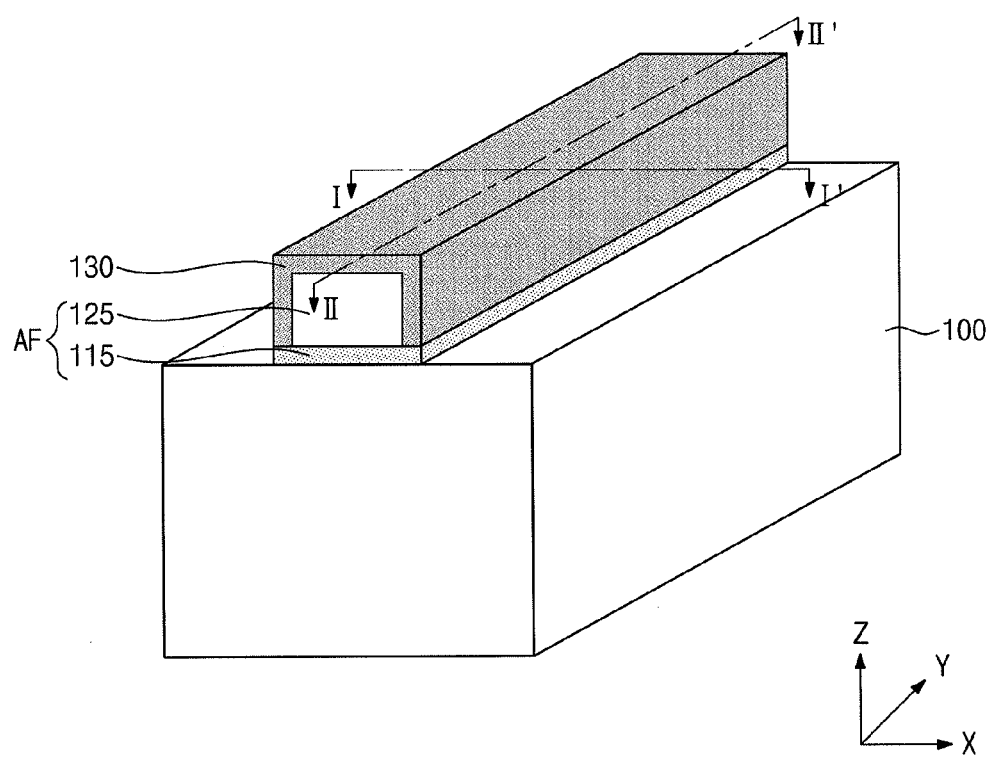
Figure 3B:
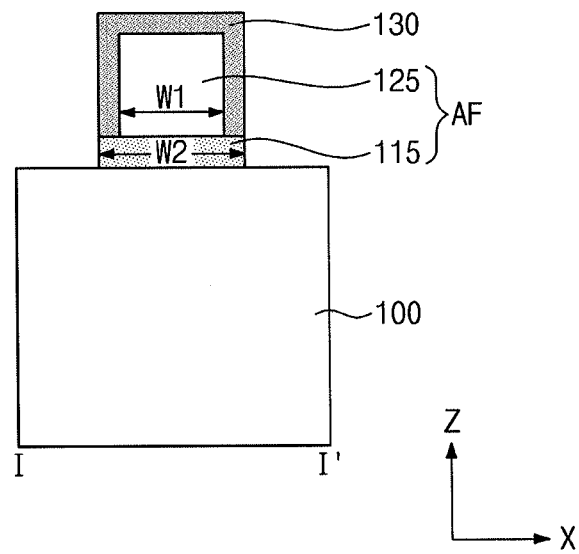
Figure 3C:
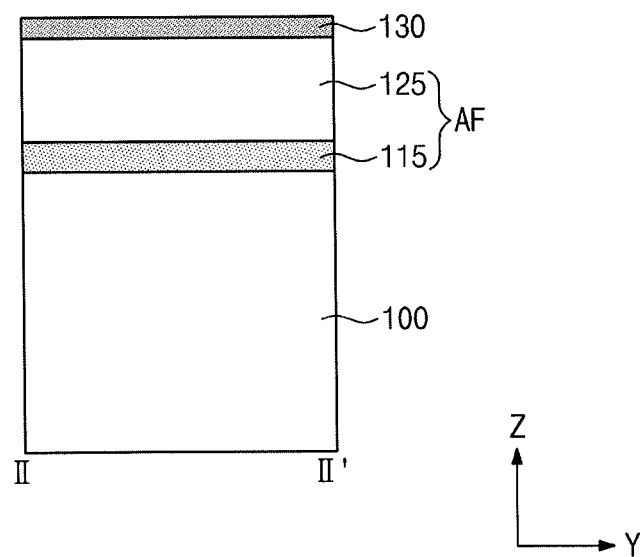

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that when a component is referred to as being "on" another component, it can be directly on the another component or intervening components may also be present therebetween. In the drawings, the thickness of components is exaggerated for effective description of technical content. Like reference numerals refer to like components throughout the specification.

Embodiments in the specification will be described with cross-sectional views and/or plane views as ideal exemplary views. In the drawings, the thickness of layers and regions is exaggerated for effective description of technical content. Thus, regions exemplified in the drawings have general properties, and are used to illustrate a specific shape of a device region. Thus, this should not be construed as limited to the scope of the present disclosure. Though terms like a first, a second, and a third are used to describe various regions and layers in various embodiments, the regions and the layers are not limited to these terms. Embodiments described and exemplified herein include complementary embodiments thereof.

The terms used in the specification are not to be limiting but to describe embodiments. The terms of a singular form may include plural forms unless referred to the contrary. The meaning of "include," "comprise," "including," or "comprising," specifies a property, a region, a fixed number, a step, a process, an operation, an element and/or a component but does not exclude other properties, regions, fixed numbers, steps, processes, operations, elements and/or components.

FIG. 1 illustrates a flow chart of a method of manufacturing a semiconductor device according to embodiments. FIGS. 2A through 10A illustrate perspective views of stages in a method of manufacturing a semiconductor device according to an embodiment, FIGS. 2B through 10B illustrate cross-sectional views taken along lines I-I' of FIGS. 2A through 10A, respectively, and FIGS. 2C through 10C illustrate cross-sectional views taken along lines II-II' of FIGS. 2A through 10A, respectively.

Referring to FIGS. 1 and 2A to 2C, a substrate 100 may be provided in operation S10. The substrate 100 may be a silicon substrate or a SOI (Silicon On Insulator) substrate. A first layer 110 may be formed on the substrate 100 and a second layer 120 may be then formed on the first layer 110. The first layer 110 and the second layer 120 may respectively include materials having different oxidation rates. As an example, the second layer 120 may include silicon and the first layer 110 may include a material (for example, silicon germanium (SiGe)) having an oxidation rate higher than the silicon. The first layer 110 and the second layer 120 may be formed through epitaxial processes.

Referring to FIGS. 1 and 3A to 3C, an active fin AF may be formed on the substrate 100 in operation S20. Firstly, a first portion 125 of the AF may be formed by patterning the second layer 120. A capping layer (not shown) may be formed on a structure including the first portion 125 of the AF and then etched therefrom so that a capping pattern 130 covering the upper surface and sidewalls of the first portion 125 of the AF may be formed. The capping pattern 130 may include e.g., SiN. Subsequently, a second portion 115 of the AF may be formed by etching the first layer 110 using the capping pattern 130 as an etch mask. As a result, the AF may include the first portion 125 having a first width W1 and the second portion 115 having a second width W2. The second width W2 may be wider than the first width W1.

Figure 4A:
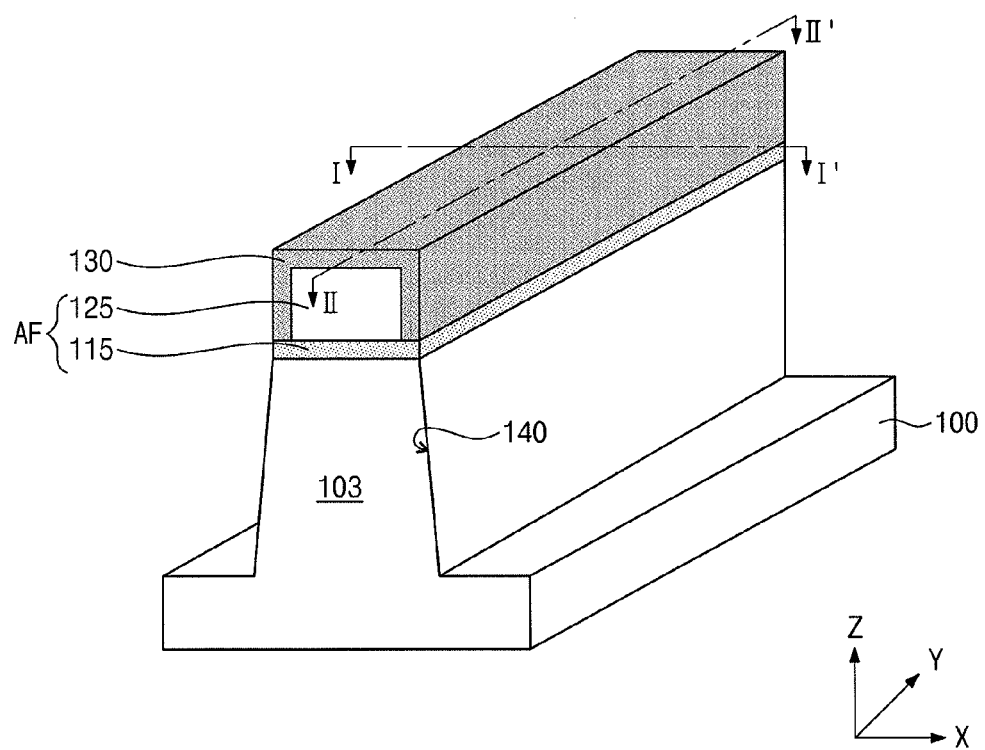
Figure 4B:
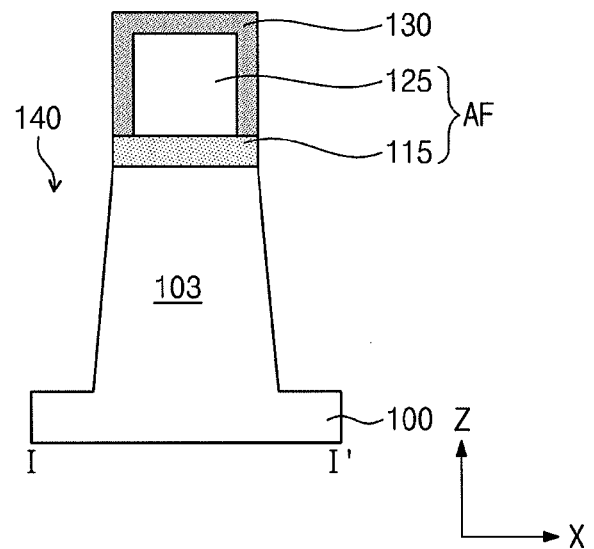
Figure 4C:
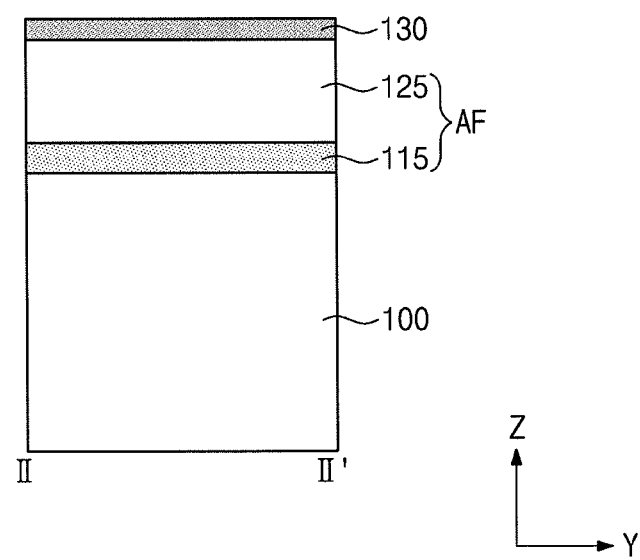

Referring to FIGS. 4A to 4C, by etching the substrate 100 by using the capping pattern 130 as an etch mask, trenches 140 defining an active pattern 103 may be formed in the substrate 100. Thus, the AF may be positioned on the active pattern 103. Etching processes of forming the second portion 115 of the AF and the trenches 140 may be successively performed using the capping pattern 130 as an etch mask. The etching processes may be performed under an etching condition having etching selectivity on the capping pattern 130. According to an embodiment, the trenches 140 may be formed to be tapered at the base, e.g., the active pattern 103 may be wider adjacent the substrate 100 than adjacent the AF in the x-z plane.

Figure 5A:
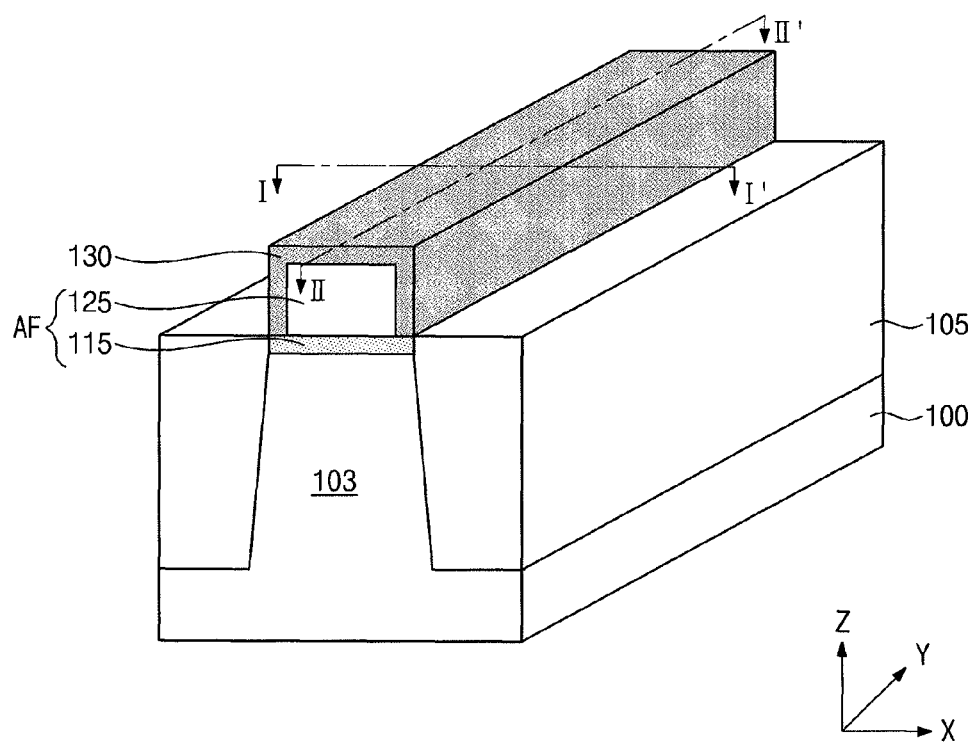
Figure 5B:
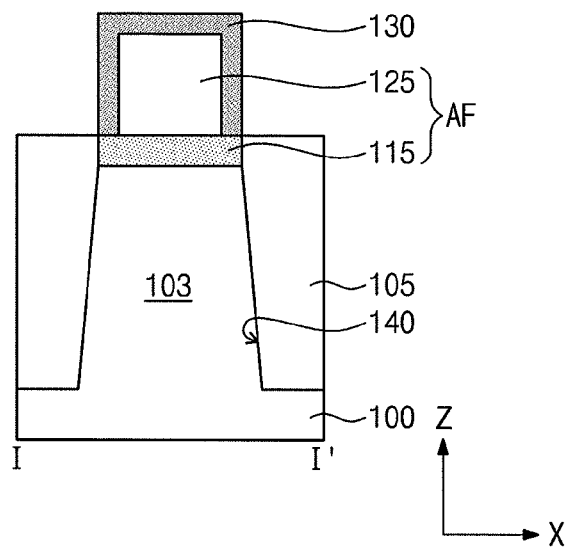
Figure 5C:
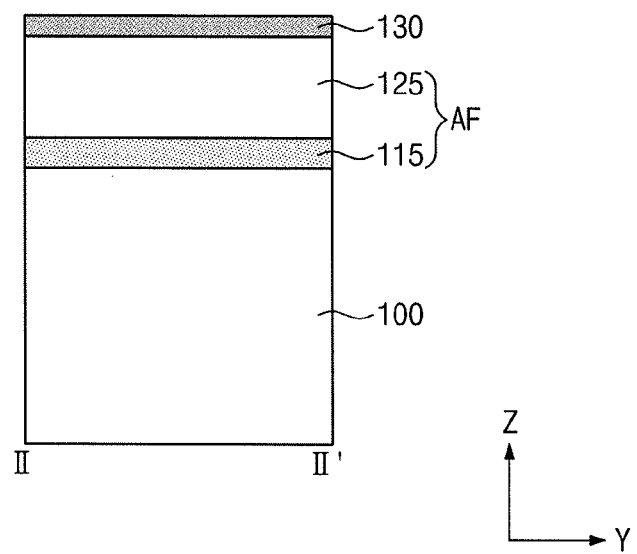
Figure 6A:
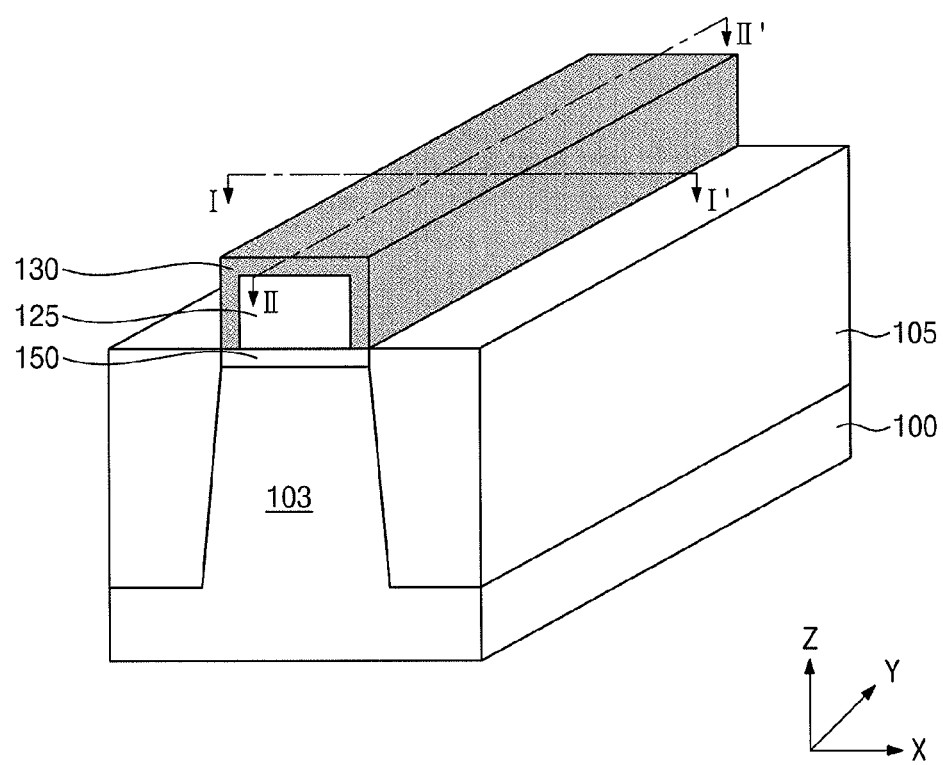
Figure 6B:
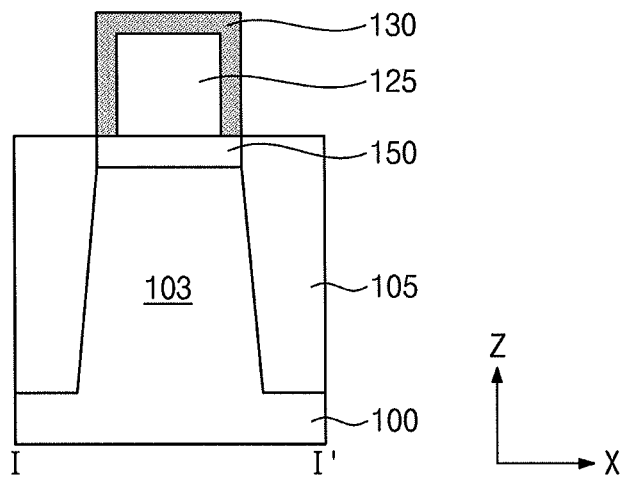
Figure 6C:
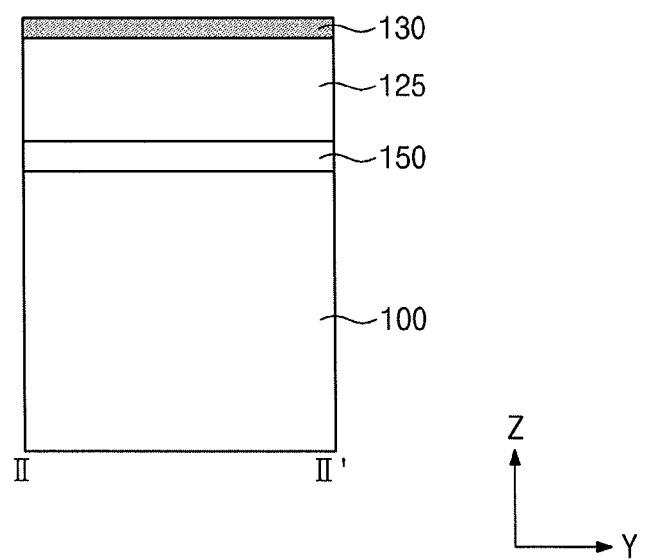

Referring to FIGS. 5A to 5C, device isolation patterns 105 that fill the trenches 140 may be formed. In detail, device isolation layer filling the trenches 140 are formed and the top of the capping pattern 130 may be exposed by planarizing the device isolation layer. Subsequently, the sidewalls of the capping pattern 130 may be exposed by etching the device isolation layer. Thus, the device isolation patterns 105 may be formed. The device isolation patterns 105 may be formed to cover the sidewalls of the second portion 115 of the AF. When the device isolation patterns 105 cover the sidewalls of the second portion 115 of the AF, the AF is supported by the device isolation patterns 105 and, thus, may be structurally stabilized during a subsequent oxidation process.

Referring to FIGS. 1 and 6A to 6C, the second portion 115 of the AF is selectively oxidized and thus a first pattern 150 may be formed, in operation S30. The first pattern 150 may be an insulating pattern. In detail, an oxidization process may be performed on a structure as described with reference to FIGS. 5A to 5C. During the oxidization process, the first portion 125 of the AF that is capped with the capping pattern 130 may not be oxidized. Oxygen atoms that are provided by the oxidization process may be supplied to the second portion 115 of the AF through the boundary between the capping pattern 130 and the device isolation patterns 105. The second portion 115 of the AF may include a material (e.g., silicon germanium (SiGe)) having a higher oxidation rate than the first portion 125 of the AF and the substrate 100. Thus, during the oxidation process, the material in the second portion 115 of the AF reacts with the oxygen atoms and thus the second portion 115 of the AF may be selectively oxidized. Accordingly, the second portion 115 of the AF may change to the first pattern 150. The first pattern 150 may include e.g., silicon oxide. The first pattern 150 may be connected to the device isolation patterns 105 which are adjacent to each other and between which the first pattern 150 is positioned. The first portion 125 of the AF may be separated from the substrate 100 by the first pattern 150.

Referring to FIGS. 1 and 7A to 7C, a first gate pattern 200 that crosses the first portion 125 of the AF may be formed on the substrate 100. According to an embodiment, the first gate pattern 200 may be a sacrifice gate pattern. Firstly, the capping pattern 130 is removed and then an etch stop layer (not shown) that covers the first portion 125 of the AF may be formed. The etch stop layer may include e.g., silicon oxide. A first gate layer (not shown) may be formed on the etch stop layer. The first gate pattern 200 may be formed by patterning the first gate layer. The first gate pattern 200 may be formed by performing an etching process with etching selectivity on the etch stop layer.

Figure 7A:
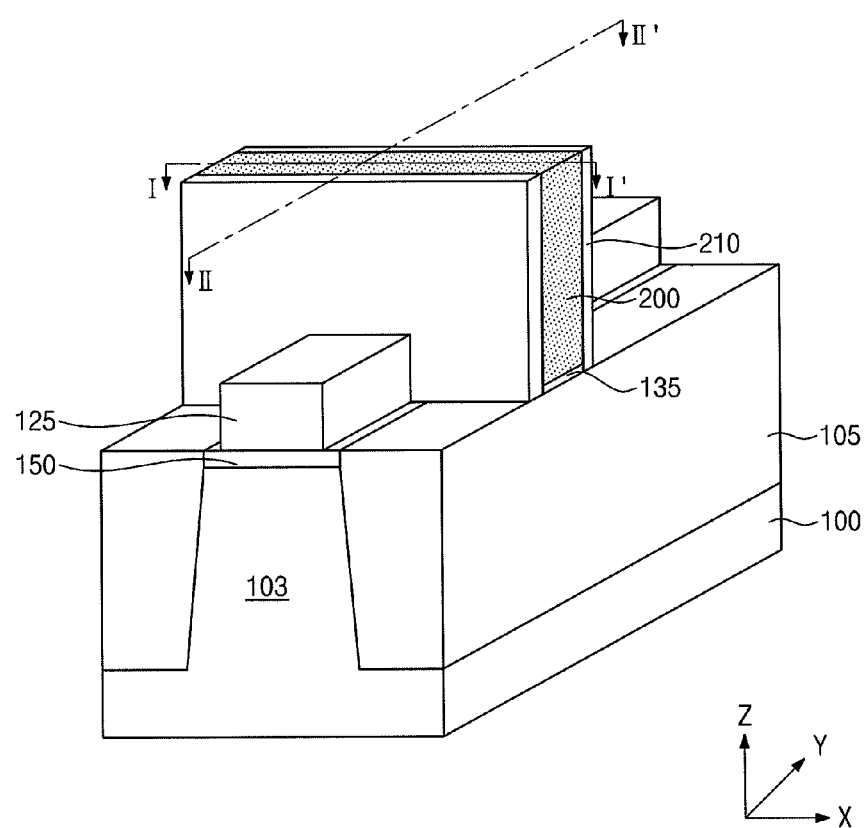
Figure 7B:
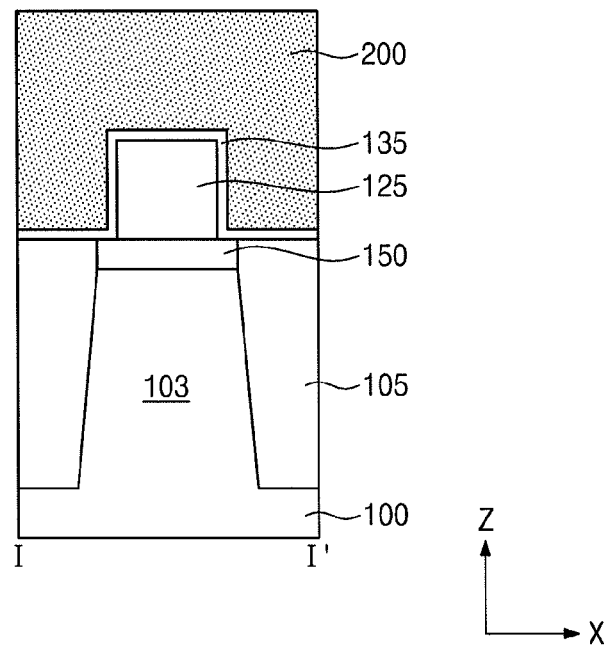
Figure 7C:
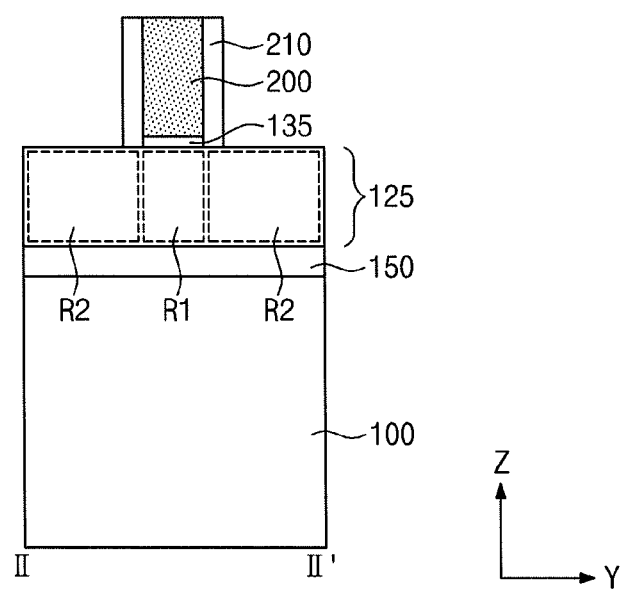
Figure 8A:
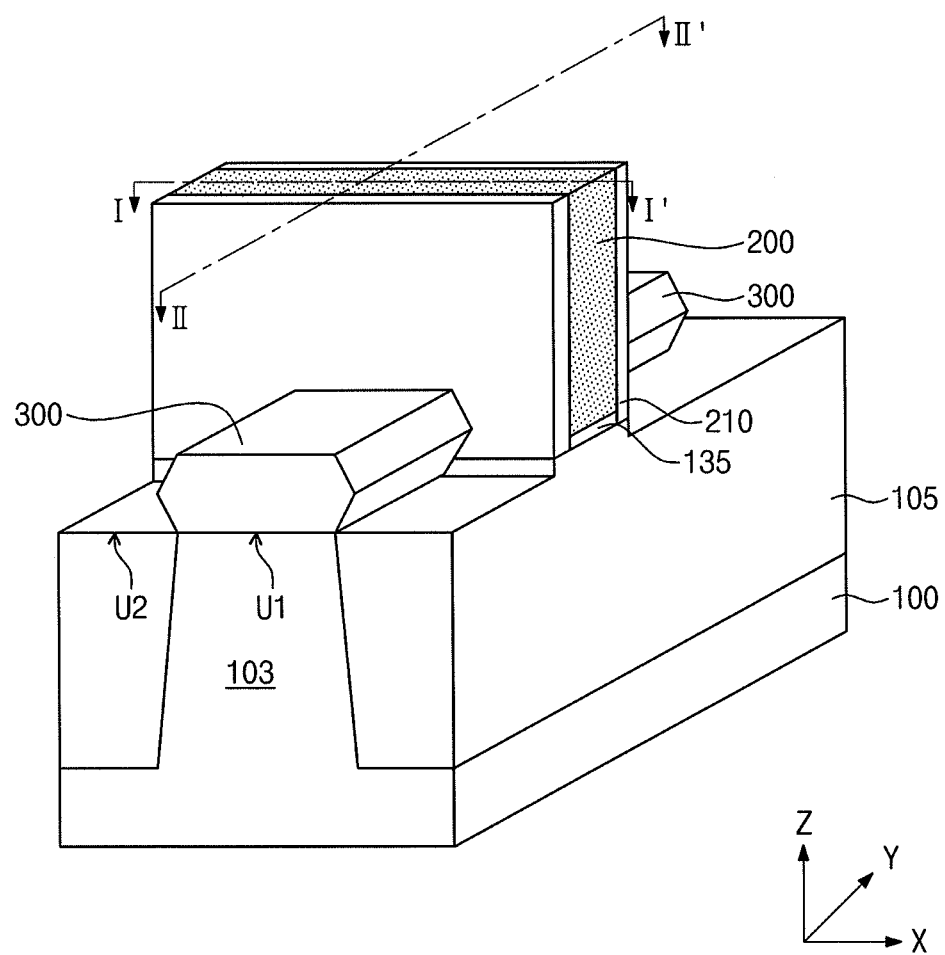
Figure 8B:
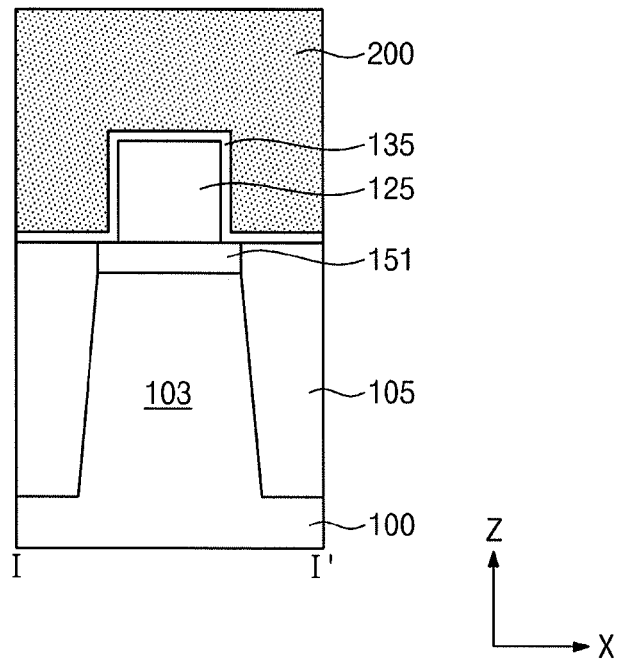
Figure 8C:
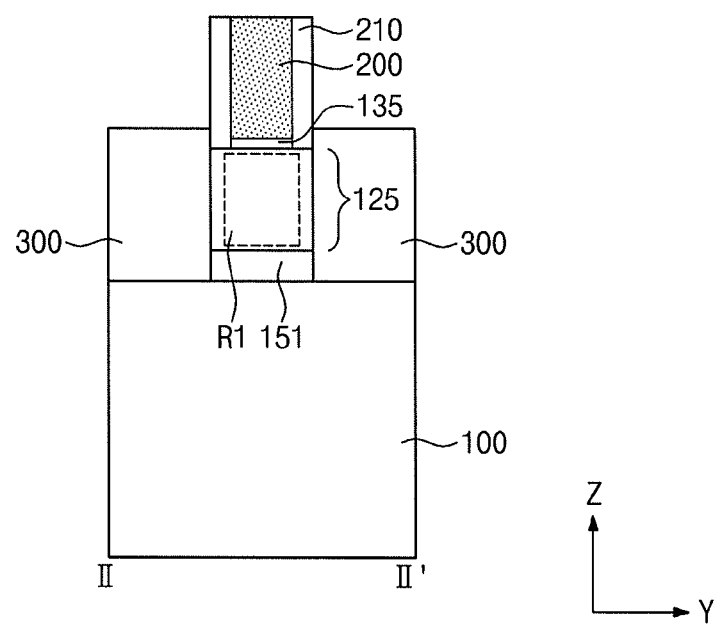

As the first gate pattern 200 is formed to cross the first portion 125 of the AF, a first region R1 and second regions R2 may be defined in the first portion 125 of the AF (see FIG. 7C). The first region R1 of the first portion 125 of the AF is positioned under the first gate pattern 200 and overlaps the first gate pattern 200. The second regions R2 of the first portion 125 of the AF are positioned on both sides of the first gate pattern 200 and horizontally separated from each other by the first region R1. After the first gate pattern 200 is formed, the etch stop layer are removed from both sides of the first gate pattern 200 so that an etch stop pattern 135 may be formed under the first gate pattern 200. The etch stop pattern 135 may extend along the bottom of the first gate pattern 200 to cover the upper surface and sidewalls of the first portion 125 of the AF. As the etch stop layer is removed, the second regions R2 that are positioned on both sides of the first gate pattern 200 may be exposed.

Gate spacers 210 may be formed on both sidewalls of the first gate pattern 200. By forming and then etching a gate spacer layer (not shown) on a structure including the first gate pattern 200, the upper surface of the device isolation patterns 105 may be exposed. During the etching process for the gate spacer layer, the upper surfaces of the second regions R2 may be exposed. In addition, according to an embodiment, during the etching process for the gate spacer layer, both sidewalls of the second regions R2 may be exposed. During the etching process, a portion of the top of the first pattern 150 that is positioned under the second regions R2 may be exposed.

Referring to FIGS. 1 and 8A to 8C, a portion of the first pattern 150 may be removed to form a second pattern 151 in operation S50. Forming the second pattern 151 may include etching the second regions R2 of the first portion 125 of the AF to expose a portion of the first pattern 150, and etching the exposed portion of the first pattern 150 to expose the substrate 100. Although not shown, the interface between the first pattern 150 formed by an oxidation process and the substrate 100 under the first pattern 150 may not be planar. Thus, it is possible to make the upper surface U1 of the substrate 100 planar by performing a wet or dry etching process on the substrate 100 that is exposed through etching a portion of the first pattern 150. During the etching process, upper portions of the device isolation patterns 105 that are not covered by the first gate pattern 200 may be etched. As a result, the upper surface U1 of the substrate 100 and upper surfaces U2 of the device isolation patterns 105 may have the same height on both sides of the first gate pattern 200

Source/drain regions 300 may be formed on both sides of the first gate pattern 200 in operation S60. The source/drain regions 300 may be formed on the positions of the second regions R2. Thus, the first region R1 may be a channel region that is interposed between the source/drain regions 300. The first region R1 may be separated from the substrate by the second pattern 151. That is, the second pattern 151 may be an insulating pattern that separates the substrate 100 from the channel region.

Forming the source/drain regions 300 may include performing an epitaxial growth process on the substrate 100 that is exposed as a portion of the first pattern 150 is removed, to form the second pattern 151. As an example, the source/drain regions 300 may include at least one of silicon germanium (SiGe), germanium (Ge), silicon (Si), and silicon carbide (SiC) that grow epitaxially from the substrate 100. As an example, in a case where a semiconductor device according to an embodiment has a CMOS structure, a first epitaxial layer for the source/drain regions of an NMOSFET and a second epitaxial layer for the source/drain regions of a PMOSFET may be formed. The first epitaxial layer may be formed to be able to cause tensile strain and the second epitaxial layer may be formed to be able to cause compressive strain. The first epitaxial layer may be formed of silicon carbide (SiC) and the second epitaxial layer may be formed of silicon germanium (SiGe) but embodiments are not limited thereto. Simultaneously with or after the epitaxial growth process, impurities may be doped on the source/drain regions 300.

According to an embodiment, the second pattern 151 (i.e, the insulating pattern), may be selectively formed only under the first region R1 (i.e. the channel region). Thus, the first region R1 (i.e. the channel region) may be separated from the substrate by the second pattern 151 (i.e. the insulating pattern). That is, since the FET according to embodiments is formed as a Fin on Insulator structure, a short channel effect may be improved. Moreover, since the source/drain regions 300 are connected directly to the substrate 100, the leakage current and self heating characteristics of the FET may be improved.

Figure 9A:
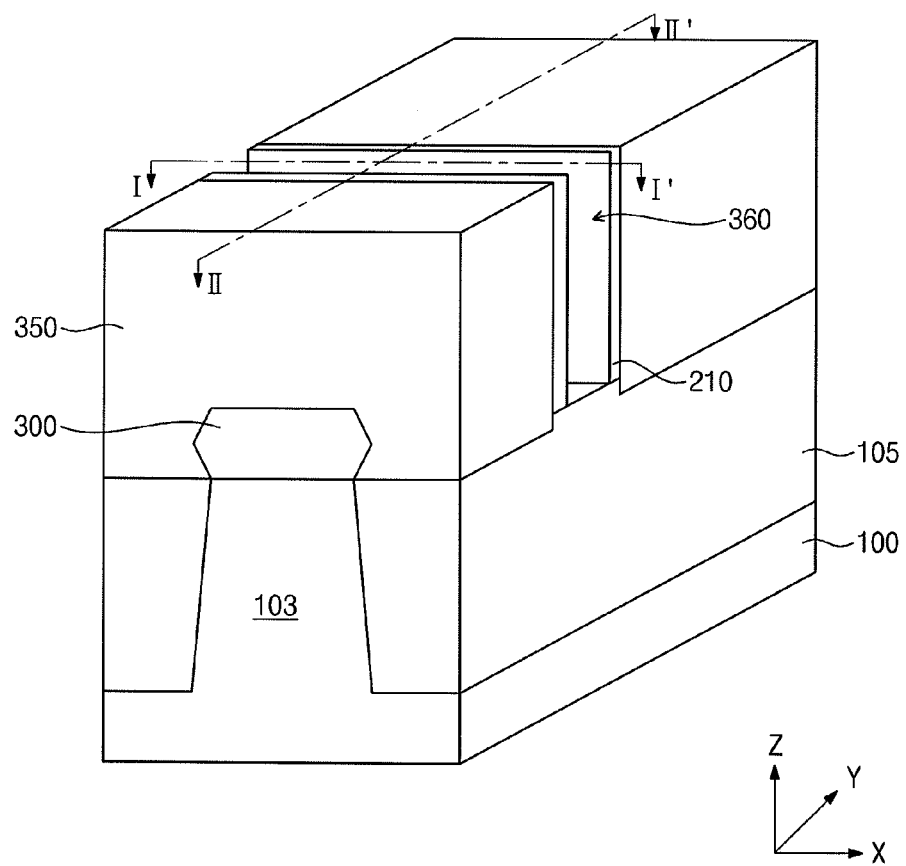
Figure 9B:
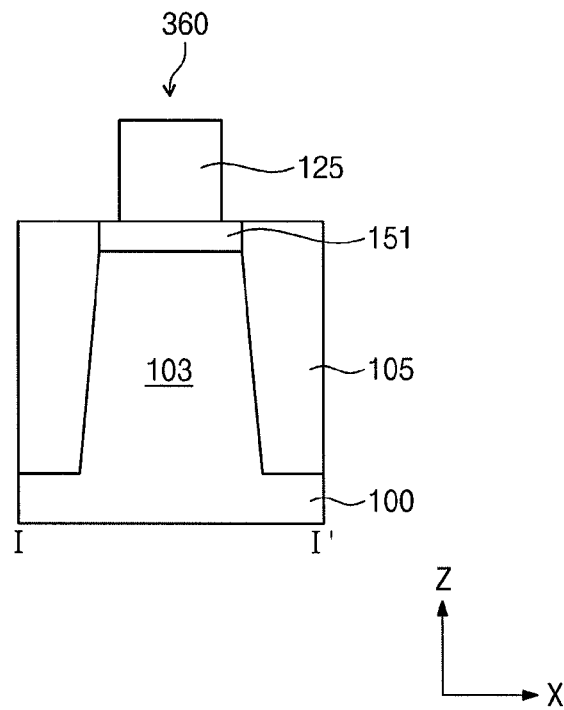
Figure 9C:
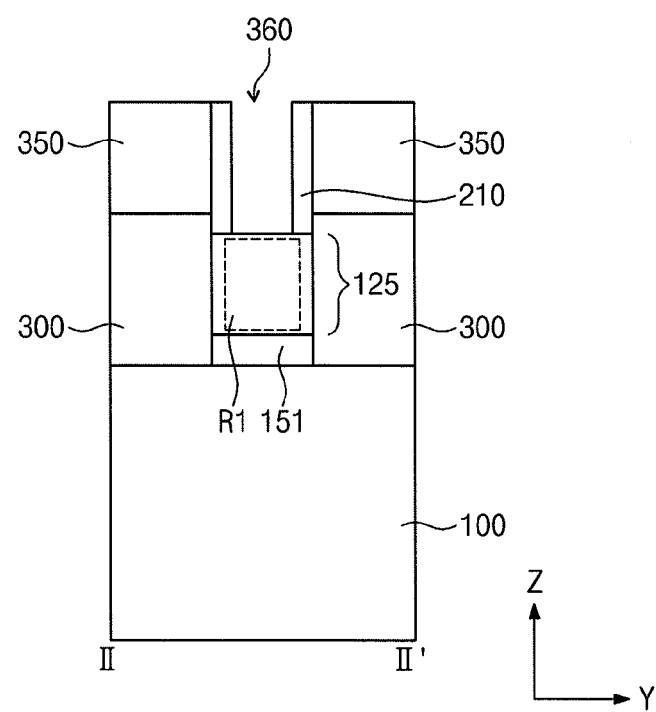
Figure 10A:
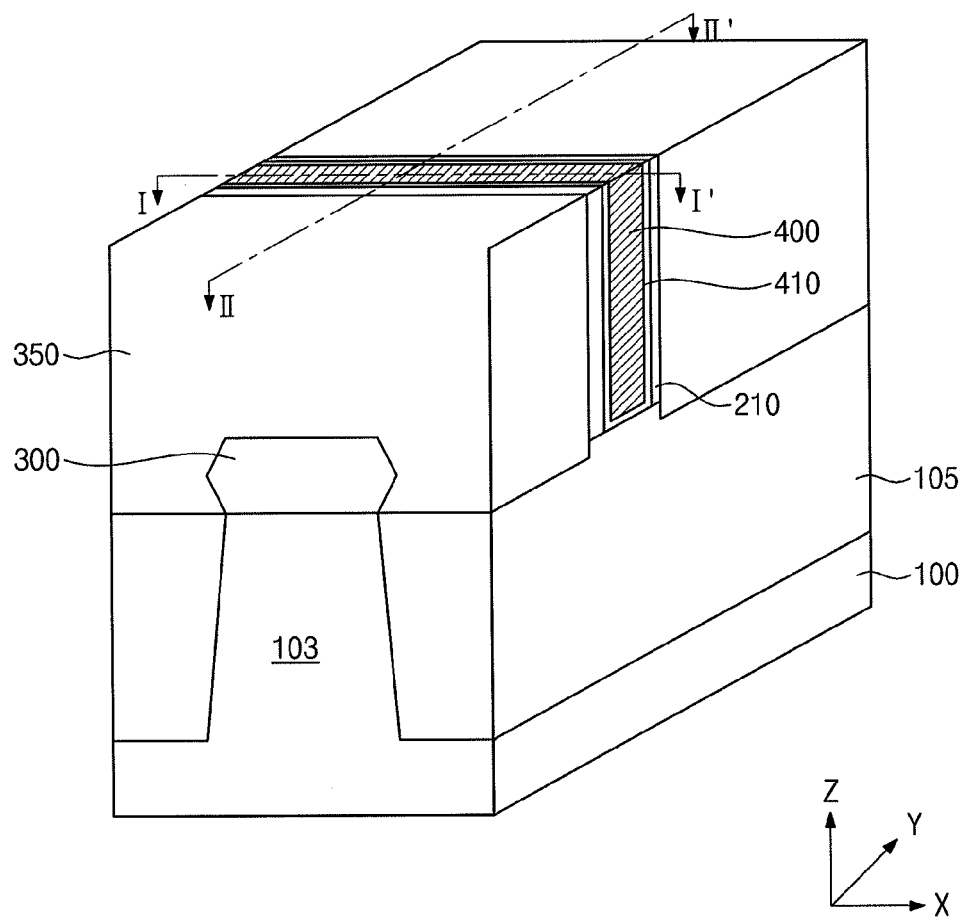
Figure 10B:
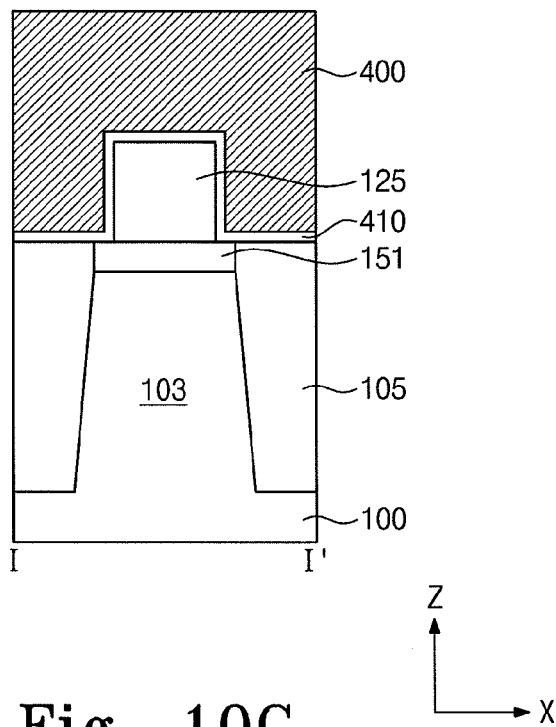
Figure 10C:
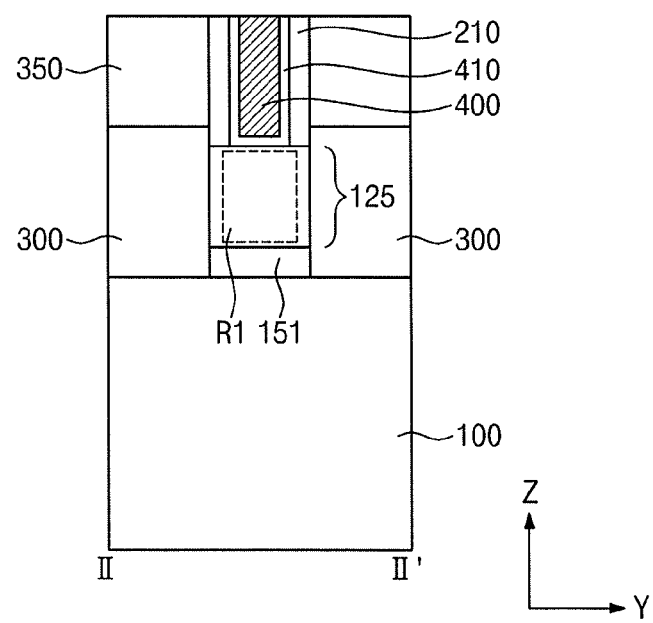

Referring to FIGS. 9A to 9C, a lower interlayer insulating layer 350 may be formed on an output that includes the source/drain regions 300. The lower interlayer insulating layer 350 may be formed to cover the source/drain regions 300 and the first gate pattern 200. The lower interlayer insulating layer 350 may include at least one of a silicon oxide layer, a silicon nitride layer, a silicon oxynitride layer and low dielectric layers. The upper surface of the first gate pattern 200 may be exposed by etching the lower interlayer insulating layer 350. Subsequently, by removing the first gate pattern 200, a gap region 360 that exposes the first portion 125 of the AF between the gate spacers 210 may be formed. Forming the gap region 360 may include performing an etching process having etching selectivity on the gate spacers 210, the lower interlayer insulating layer 350, and the etch stop pattern 135 to etch the first gate pattern 200. Moreover, forming the gap region 360 may further include removing the etch stop pattern 135 to expose the first portion 125 of the AF.

Referring to FIGS. 1 and 10A to 10C, a gate dielectric pattern 410 and a second gate pattern 400 that fill the gap region 360 may be formed in operation S70. Firstly, a gate dielectric layer (not shown) may be formed on a structure including the gap region 360, thus filling a portion of the gap region 360. The gate dielectric layer may be formed to cover the first portion 125 of the AF. The gate dielectric layer may include at least one high dielectric layer. As an example, the gate dielectric layer may include at least one of hafnium oxide, hafnium silicate, zirconium oxide, and zirconium silicate, but is not limited thereto. The gate dielectric layer may be formed by performing e.g., an atomic layer deposition process. A second gate layer (not shown) may be formed on the gate dielectric layer to fill the remaining portions of the gap region 360. A second gate layer may include at least one of conductive metal nitride (e.g., titanium nitride, tantalum nitride, etc.) and metal (e.g., aluminum, tungsten, etc.)

The gate dielectric pattern 410 and the second gate pattern 400 may be formed by performing a planarization process on the gate dielectric layer and the second gate layer that are sequentially stacked. The upper surfaces of the lower interlayer insulating layer 350 and the gate spacer 210 may be exposed by the planarization process. The gate dielectric pattern 410 may extend along the bottom surface of the second gate pattern 400 and may be arranged on both sides of the second gate pattern 400 to be interposed between the second gate pattern 400 and the gate spacer 210.

According to an embodiment, the second gate pattern 400 may function as a gate electrode. As an example, in a case where a semiconductor device according to an embodiment is a CMOS structure, forming the second gate pattern 400 may include forming a gate electrode of an NOSFET and forming a gate electrode of a PMOSFET that is practiced independently of the previous operation. However, embodiments are not limited to the above-described examples in which the gate electrodes of the NMOSFET and PMOSFET are independently formed.

Although not shown, an upper interlayer insulating layer may be formed on a structure including the second gate pattern 400. Contact holes that expose the source/drain regions 300 through the upper interlayer insulating layer and the lower interlayer insulating layer 350 may be formed. Contact plugs that fill the contact holes may be formed. Wirings that access the contact plugs may be formed on the upper interlayer insulating layer. As a result, the wirings may be formed on the upper interlayer insulating layer to be connected to the source/drain regions 300 through the contact plugs.

Figure 11A:
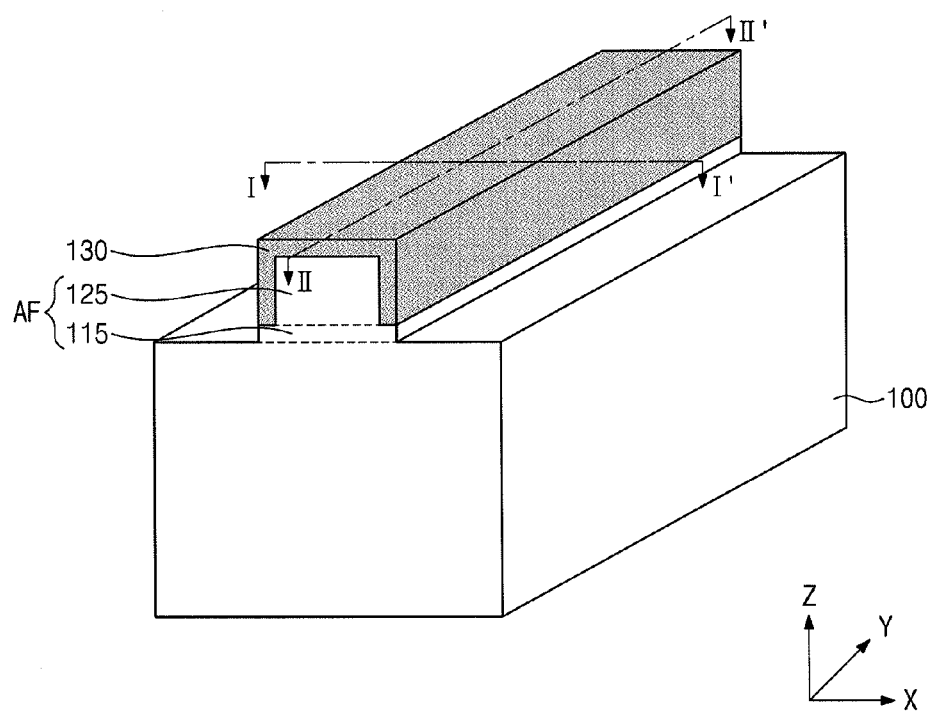
Figure 11B:
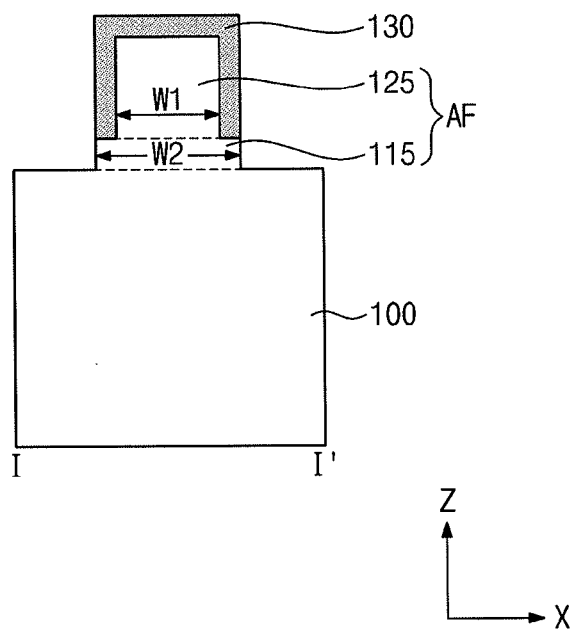
Figure 11C:
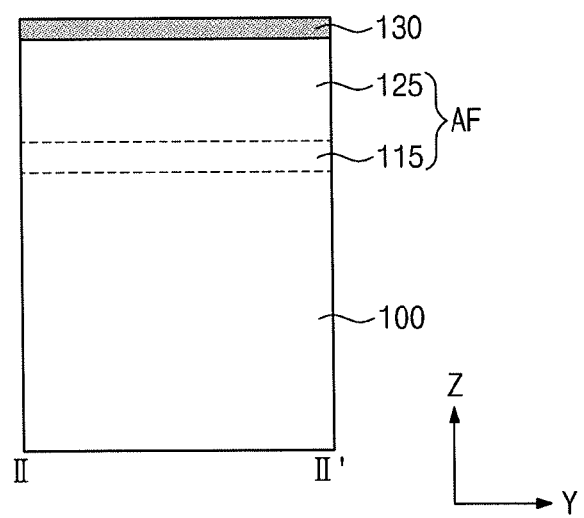
Figure 12A:
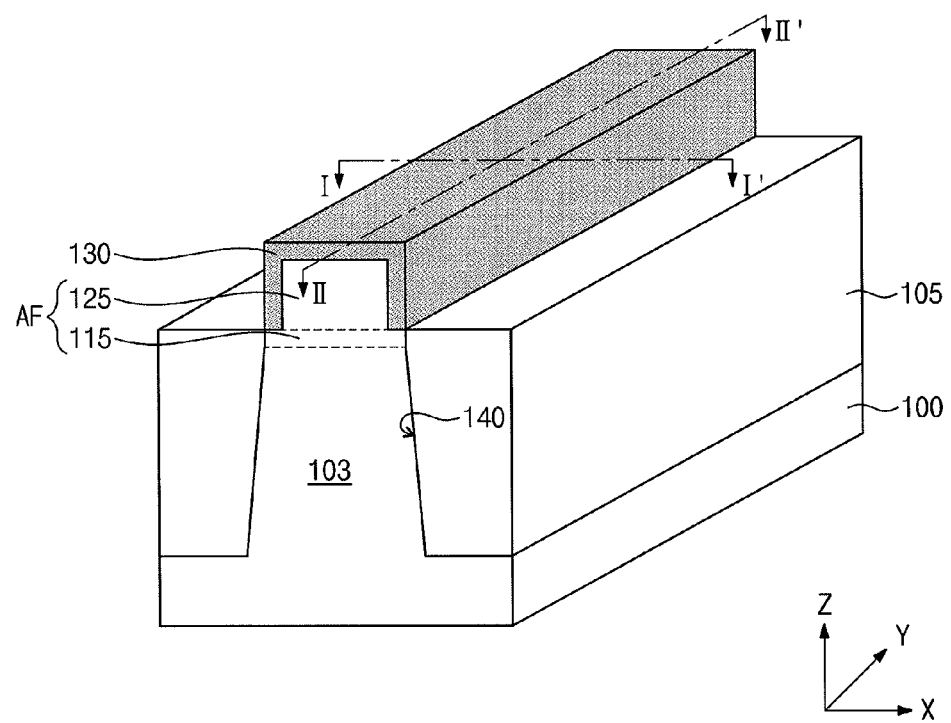
Figure 12B:
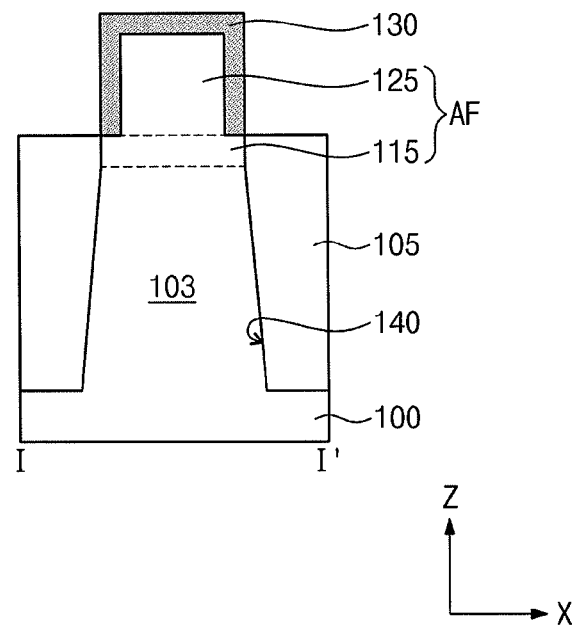
Figure 12C:
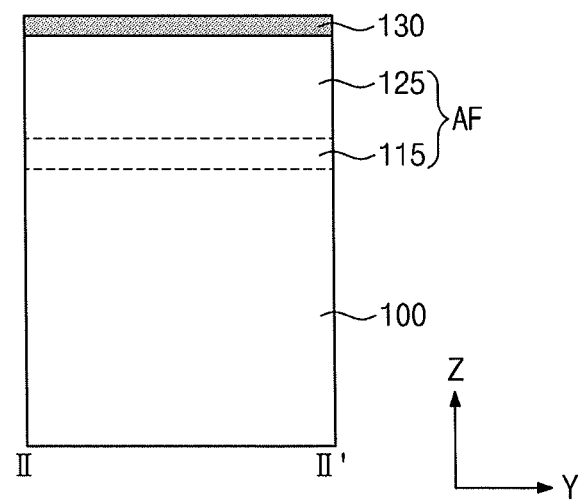
Figure 13A:
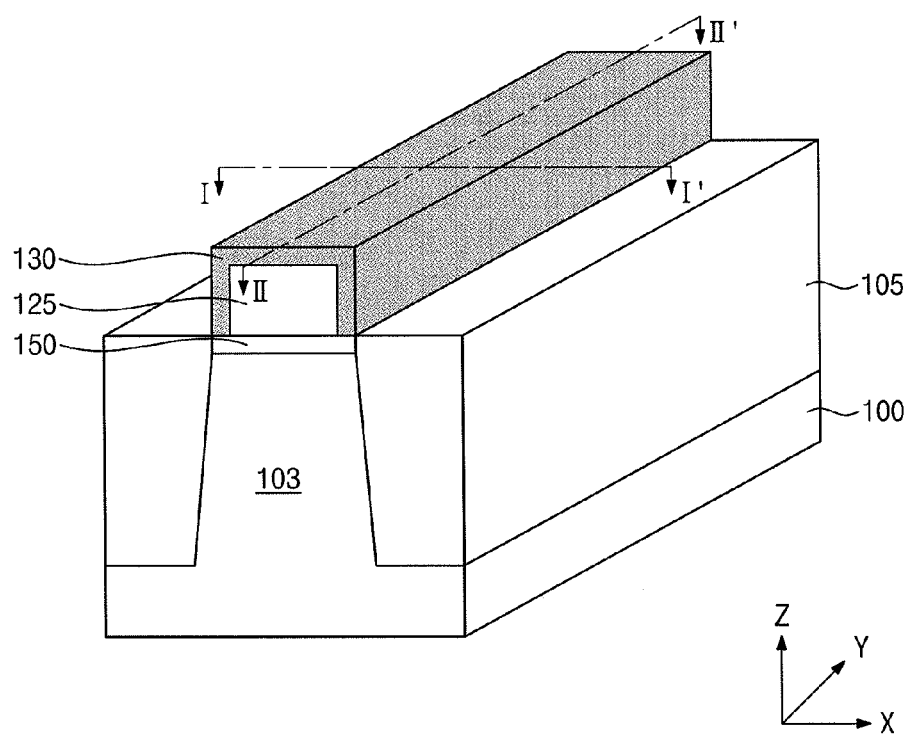
Figure 13B:
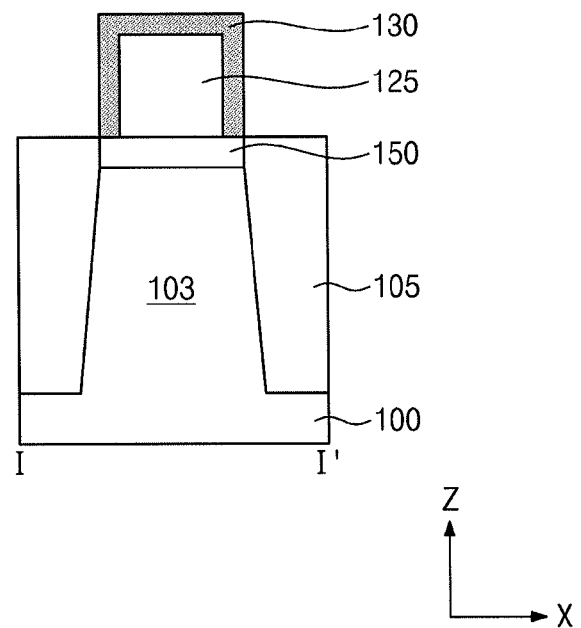
Figure 13C:
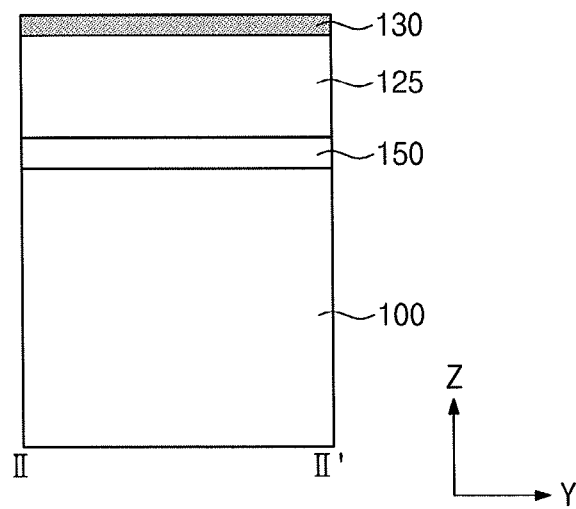

FIGS. 11A, 12A, and 13A illustrate perspective views of stages in a method of manufacturing a semiconductor device according to another embodiment, FIGS. 11B, 12B, and 13B illustrate cross-sectional views taken along lines I-I' of FIGS. 11A, 12A, and 13A, respectively, and FIGS. 11C, 12C, and 13C illustrate cross-sectional views taken along lines II-II' of FIGS. 11A, 12A, and 13A, respectively. In this embodiment, the same reference numerals are provided to the same configurations as the method of manufacturing the semiconductor device according to the embodiment that is described with reference to FIGS. 2A to 10C, and redundant descriptions may be omitted for simplicity of the description.

Referring to FIGS. 1 and 11A to 11C, the substrate 100 may be provided in operation S10. The substrate 100 may be a silicon substrate or an SOI substrate. An active fin AF may be formed by patterning the substrate 100 in operation S20. Unlike the previous embodiment, separate layers may not be provided on the substrate 100 in the present embodiment before the AF is formed. Firstly, a first portion 125 of the AF may be formed by patterning the substrate 100. By forming and then etching a capping layer (not shown) on a structure including the first portion 125 of the AF; a capping pattern 130 that covers the upper surface and sidewalls of the first portion 125 of the AF may be formed. The capping pattern 130 may include, e.g., SiN. Subsequently, a second portion 115 of the AF may be formed by etching the substrate 100 by using the capping pattern 130 as an etch mask. As a result, the AF may include the first portion 125 having a first width W1 and the second portion 115 having a second width W2 that is wider than the first width W1.

Referring to FIGS. 12A to 12C, after forming the AF, trenches 140 that define the active pattern 103 at the substrate 100 may be formed by etching the substrate 100 by using the capping pattern 130 as an etch mask. Thus, the AF may form one body, e.g., be integral, with the active pattern 103. The etching process of forming the second portion 115 of the AF and trenches 140 may be successively performed by using the capping pattern 130 as an etch mask. Subsequently, device isolation patterns 105 that fill the trenches 140 may be formed. The device isolation patterns 105 may cover the sidewalls of the second portion 115 of the AF. When the device isolation patterns 105 cover the sidewalls of the second portion 115 of the AF, the AF are supported by the device isolation patterns 105 and, thus, may be structurally stabilized during subsequent oxidation processes.

Referring to FIGS. 1 and 13A to 13C, the second portion 115 of the AF may be selectively oxidized to form the first pattern 150 in operation S30. In detail, an oxidation process may be performed on a structure as described with reference to FIGS. 12A to 12C. During the oxidation process, the first portion 125 of the AF that is capped with the capping pattern 130 may not be oxidized. Oxygen atoms that are provided by the oxidation process may be supplied to the second portion 115 of the AF through the boundary between the capping pattern 130 and the device isolation patterns 105. Thus, during the oxidation process, the second portion 115 of the AF may be selectively oxidized and changed to the first pattern 150. The first pattern 150 may include e.g., silicon oxide. The first pattern 150 may be connected to the device isolation patterns 105 which are adjacent to each other and between which the first pattern 150 is positioned. The first portion 125 of the AF may be separated from the substrate 100 by the first pattern 150.

Subsequent processes may be similar to those of the method of manufacturing the semiconductor device according to the embodiment that is described with reference to FIGS. 7A to 10C. The structural characteristics of the semiconductor device according to embodiments will be described with reference to FIGS. 10A to 10C.

The device isolation patterns 105 that define the active pattern 103 may be arranged on the substrate 100. The device isolation patterns 105 may have a line shape extended in a first direction (e.g., in the Y direction). The first portion 125 of the AF may be arranged on the substrate 100, the first portion 125 protruding from the substrate 100 in a third direction (e.g., in the Z direction) that is perpendicular to both the first direction (Y) and a second direction (e.g., in the X direction) intersecting the first direction (Y). The first portion 125 of the AF may extend along the second direction (X). The first portion 125 of the AF may be arranged on the active pattern 103. The gate electrode 400 may be arranged on the substrate 100 to cross, e.g., overlap, the first portion 125 of the AF. The first portion 125 of the AF may be a channel region that is positioned under the gate electrode 400 in the Y-Z plane of FIG. 10C. The gate electrode 400 may be formed to cover the upper surface and both sidewalls of the first portion 125 of the AF in the X-Z plane of FIG. 10B.

The first portion 125 of the AF may be separated from the active pattern 103 by the second pattern 151 that is arranged under the first portion 125. The second pattern 151 may be an insulating pattern that is formed by the oxidation of the second portion 115 of the AF. The second pattern 151 may be connected to the device isolation patterns 105 which are adjacent to each other and between which the second pattern 151 is positioned in the X-Z plane of FIG. 10B. The second pattern 151 may be wider than the first portion 125 of the AF in along the X-direction. The source/drain regions 300 that grow epitaxially from the substrate 100 may be arranged on both sides of the gate electrode 400. That is, the source/drain regions 300 may be connected to directly to the substrate 100. The first portion 125 of the AF may have an upper surface higher than a lower surface of the source/drain regions 300 and a lower than an upper surface of the source/drain regions 300 in a vertical position, e.g., along the Z-direction, and may have a lower surface higher than the lower surface of the source/drain regions 300. The first portion 125 of the AF may be positioned between the source/drain regions 300 in a horizontal position, e.g., along the Y-direction. The second pattern 151 may be arranged between the source/drain regions 300. Thus, the second pattern 151 may be locally arranged under the first portion 125 of the AF. The height of the upper surface of the second pattern 151 may be lower than the height of the lowest surface of the gate electrode 400 in the Z-direction.

The lower interlayer insulating layer 350 that covers the source/drain regions 300 and both sidewalls of the gate electrode 400 may be arranged on the substrate 100. The gate spacers 210 may be arranged between the lower interlayer insulating layer 350 and the gate electrode 400. The gate dielectric pattern 410 may be arranged between the gate spacers 210 and the gate electrode 400. The gate dielectric pattern 410 may also be arranged between the gate electrode 400 and the first portion 125 of the AF. The gate dielectric pattern 410 may include at least one high dielectric layer. As an example, the gate dielectric pattern 410 may include at least one of hafnium oxide, hafnium silicate, zirconium oxide, and zirconium silicate. The gate dielectric pattern 410 may extend horizontally from the first portion 125 of the AF to partially cover the upper surfaces of the device isolation patterns 105. Furthermore, according to the embodiments, the upper surfaces of the device isolation patterns 105 may have portions that are not covered by the gate dielectric pattern 410. As an example, the upper surfaces of the device isolation patterns 105 that is not covered by the gate electrodes 400 may be covered by the lower interlayer insulating layer 350. The gate dielectric pattern 410 may extends along the bottom surface of the gate electrode 400.

According embodiments, the insulating pattern may be selectively formed only under the channel region. Thus, the channel region may be separated from the substrate 100 by the insulating pattern. That is, since a FET according to embodiments is formed as a Fin on Insulator structure, a short channel effect may be improved. Moreover, since source/drain regions 300 are connected to directly to the substrate 100, the leakage current and self heating characteristics of the FET may be improved.

Figure 14:
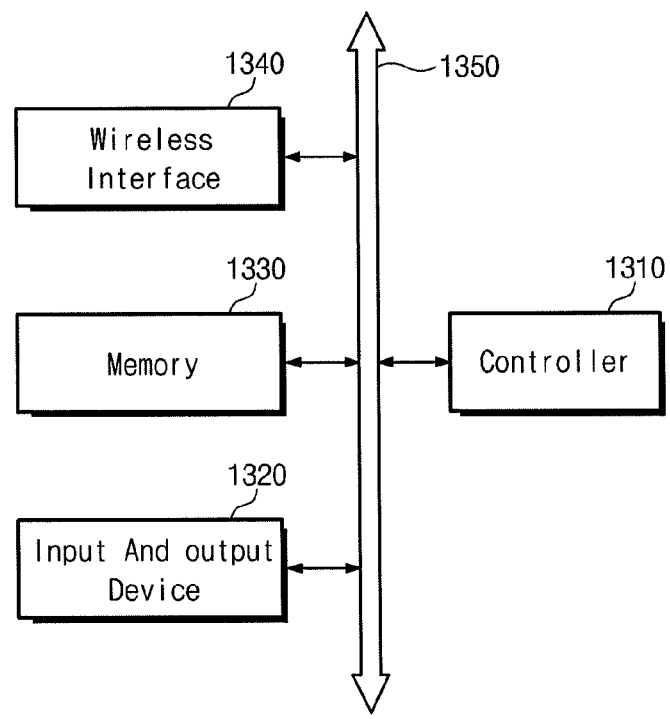
FIGS. 14 and 15 illustrate schematic diagrams of electronic devices that include a semiconductor device according to embodiments.
Figure 15:
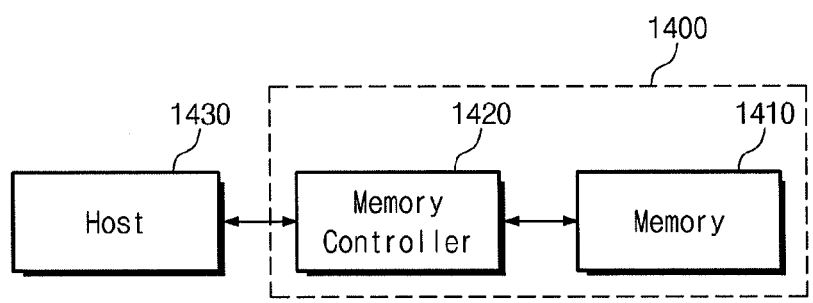

FIGS. 14 and 15 illustrate schematic diagrams of electronic devices including a semiconductor device according to embodiments.

Referring to FIG. 14, an electronic device 1300 that includes a semiconductor device according to embodiments may be one of a PDA, a laptop computer, a portable computer, a web tablet, a wireless phone, a cellular phone, a digital music player, wired/wireless electronic equipment, and a composite electronic device including at least two thereof. The electronic device 1300 may include a controller 1310, a key pad, keyboard, an input and output display 1320 such as a display, a memory 1330, and a wireless interface 1340 that are coupled to each other through a bus 1350. The controller 1310 may include, for example, one or more microprocessors, a digital signal processor, a micro controller, or the like. The memory 1330 may be used for storing, for example, commands that are executed by the controller 1310. The memory 1330 may be used for storing user data and include the semiconductor device according to the above-described embodiments. The electronic device 1300 may use the wireless interface 1340 to transmit data to a wireless communication network communicating by using RF signals or to receive data from the network. For example, the wireless interface 1340 may include an antenna, a wireless transceiver, etc. The electronic device 1300 may be used for implementing a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

Referring to FIG. 15, semiconductor devices according to embodiments may be used for implementing a memory system 1400. The memory system 1400 may include a memory device 1410 for storing massive data and a memory controller 1420. The memory controller 1420 controls the memory device 1410 so that data is read/written from/to the memory device in response to a read/write request from a host 1430. The memory controller 1420 may configure an address mapping table for mapping an address provided from the host 1430 such as mobile equipment or a computer system to a physical address of the memory device 1410. The memory device 1410 may include a semiconductor device according to the above-described embodiments.

The present disclosure provides a semiconductor device and a method of manufacturing the same that improve a short channel effect.

The present disclosure also provides a semiconductor device and a method of manufacturing the same that improve leakage current and self heating characteristics. Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A method of manufacturing a semiconductor device, the method comprising:
    forming device isolation patterns on a substrate;
    forming an active fin on the substrate, such that the active fin protrudes from the substrate in a direction perpendicular to an upper surface of the substrate;

oxidizing a portion of the active fin to form an insulating pattern between the active fin and the substrate, such that the insulating pattern electrically insulates the active fin from the substrate;

forming a first gate pattern on the substrate, wherein the first gate pattern crosses the active fin;

exposing the substrate on both sides of the first gate pattern; and forming source/drain regions on the exposed substrate, such that the source/drain regions are arranged on both sides of the first gate pattern, and are connected to the substrate, wherein the insulating pattern is connected to the device isolation patterns which are adjacent to each other and between which the insulating pattern is positioned.

2. The method as claimed in claim 1, wherein forming the active fin on the substrate comprises:

forming a first layer on the substrate;

forming a second layer on the first layer;

patterning the second layer to form a first portion of the active fine; and patterning the first layer to form a second portion of the active fin, and wherein an oxidation rate of the first layer is higher than that of the second layer.

3. The method as claimed in claim 2, wherein patterning the first layer to form the second portion of the active fin comprises:

forming a capping pattern that covers an upper surface and sidewalls of the first portion of the active fin; and etching the first layer by using the capping pattern as an etch mask.

4. The method as claimed in claim 2, wherein oxidizing the portion of the active fin to form the insulating pattern between the active fin and the substrate comprises selectively oxidizing the second portion of the active fin.

5. The method as claimed in claim 1, wherein the device isolation patterns define an active pattern, and the active fin is formed on the active pattern and separated from the active pattern by the insulating pattern.

6. The method as claimed in claim 1, wherein the active fin includes a first region under the first gate pattern and second regions on both sides of the first gate pattern, and exposing the substrate on both sides of the first gate pattern comprises:

etching the second regions of the active fin to expose a portion of the insulating pattern; and etching the exposed portion of the insulating pattern.

7. The method as claimed in claim 1, wherein forming the source/drain regions on the exposed substrate comprises growing an epitaxial layer from the exposed substrate.

8. The method as claimed in claim 1, further comprising forming a gate spacers on both sidewalls of the first gate pattern.

9. The method as claimed in claim 8, further comprising:

forming an interlayer insulating layer on the substrate, wherein the interlayer insulating layer covers both sidewalls of the gate spacers and the source/drain regions; and replacing the first gate pattern with a second gate pattern, wherein the replacing the first gate pattern with the second gate pattern comprises:

removing the first gate pattern to form a gap region that exposes the active fin;

forming a gate dielectric pattern that fills a portion of the gap region; and forming a metal gate pattern that fills remaining portions of the gap region.

10. The method as claimed in claim 1, wherein forming the active fin on the substrate comprises:

patterning the substrate to form a first portion of the active fin;

forming a capping pattern that covers an upper surface and sidewalls of the first portion of the active fin; and etching the substrate by using the capping pattern as an etch mask to form a second portion of the active fin, the second portion of the active fin having a width wider than that of the first portion of the active fin.

11. A semiconductor device, comprising:

a substrate including device isolation patterns;

an active fin protruding from the substrate in a direction perpendicular to an upper surface of the substrate;

an insulating pattern between the active fin and the substrate, the insulating pattern electrically insulating the active fin from the substrate;

a gate electrode on the active fin; and source/drain regions arranged on both sides of the gate electrode, wherein the source/drain regions are connected to the substrate, and wherein the insulating pattern is connected to the device isolation patterns which are adjacent to each other and between which the insulating pattern is positioned.

12. The semiconductor device as claimed in claim 11, wherein the active fin is arranged between the source/drain regions and under the gate electrode, the active fin being completely electrically separated from the substrate by the insulating pattern.

13. The semiconductor device as claimed in claim 11, wherein a height of an upper surface of the insulating pattern is lower than a height of a lowest surface of the gate electrode.

14. The semiconductor device as claimed in claim 11, wherein the entirety of the insulating pattern is arranged between the source/drain regions along a first direction, and between the isolation patterns along a second direction orthogonal to the first direction.

15. The semiconductor device as claimed in claim 11, wherein the insulating pattern and the source/drain regions have a non-overlapping relationship as viewed from top view.

16. A semiconductor device, comprising:

a substrate having device isolation patterns defining active patterns;

an active fin protruding from the substrate in a first direction perpendicular to an upper surface of the substrate;

an insulating pattern between the active fin and the substrate;

a gate electrode on the active fin; and source/drain regions on both sides of the gate electrode, wherein the source/drain regions are directly connected to the substrate, and wherein the insulating pattern is between adjacent device isolation patterns and between the source/drain regions.

17. The semiconductor device as claimed in claim 16, wherein the active fin extends in a second direction, perpendicular to the first direction, and the insulating pattern is wider than the active fin in a third direction, perpendicular to the first and second directions.

18. The semiconductor device as claimed in claim 16, wherein the adjacent device isolation patterns completely cover sidewalls of the insulating pattern along the first direction.

19. The semiconductor device as claimed in claim 16, wherein an upper surface of the active fin is below an upper surface of the source/drain regions and a lower surface of the active fin is above a lower surface of the source/drain regions along the first direction.

20. The semiconductor device as claimed in claim 19, wherein a lower surface of the insulating layer is at a same level as the lower surface of the source/drain regions along the first direction.

* * * * *